(12) United States Patent
Yoshizawa et al.

(10) Patent No.: US 7,091,618 B2
(45) Date of Patent: Aug. 15, 2006

(54) SEMICONDUCTOR DEVICE AND METHOD OF MANUFACTURING THE SAME

(75) Inventors: Takahiko Yoshizawa, Yokohama (JP); Noriaki Matsunaga, Chigasaki (JP); Naofumi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/806,413

(22) Filed: Mar. 23, 2004

(65) Prior Publication Data

US 2005/0151266 A1    Jul. 14, 2005

(30) Foreign Application Priority Data

Jan. 9, 2004  (JP) ............................. 2004-004553

(51) Int. Cl.
  *H01L 23/532* (2006.01)
(52) U.S. Cl. ............................ 257/774; 257/E23.167
(58) Field of Classification Search ................. 257/774
See application file for complete search history.

(56) References Cited

U.S. PATENT DOCUMENTS

2002/0187625 A1* 12/2002 Shimooka et al. .......... 438/618

OTHER PUBLICATIONS

J. C. Lin, et al. "Via First Dual Damascene Integration of Nanoporous Ultra Low-k Material", Proceedings of International Interconnect Technology Conference, 2002, pp. 48-50.

T. Mourier, et al. "Porous Low k Pore Sealing Process Study for 65 nm and Below Technologies", Proceeding of International Interconnect Technology Conference, 2003, pp. 245-247.

* cited by examiner

*Primary Examiner*—Evan Pert
*Assistant Examiner*—Benjamin P. Sandvik
(74) *Attorney, Agent, or Firm*—Oblon, Spivak, McClelland, Maier & Neustadt, P.C.

(57) ABSTRACT

An insulating film having dielectric constant not greater than 2.7 is provided above a semiconductor substrate. A via comprises a conductive material, which is provided in a via hole formed in the insulating film. A first interconnection comprises a conductive material, which is provided in an interconnection trench formed on the via in the insulating film. A first high-density region is formed in the insulating film, and has a cylindrical shape surrounding the via, an inner surface common to the boundary of the via hole, and a film density higher than the insulating film.

27 Claims, 7 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-004553, filed Jan. 9, 2004, the entire contents of which are incorporated herein by reference.

BACKGROUND OF THE INVENTION

1. Field of the Invention

The present invention relates to a semiconductor device. For example, the present invention relates to a semiconductor device using materials having low dielectric constant (low-k material) as interlayer insulating film.

2. Description of the Related Art

In semiconductor devices having multi-layer interconnection structure, it is know that low dielectric constant materials are used as an interlayer insulating film in order to reduce interconnection (wiring) capacitance. Generally, in order to realize a material having low dielectric constant such as dielectric constant k not greater than 2.7, the material is formed with pore to have a low density.

The following problems arise if the semiconductor devices having multi-layer interconnection structure are manufactured using a porous film (or low density film having a film density not greater than about 1.5) containing the foregoing pore.

First, a low-k film has low strength; for this reason, there is a possibility that the film cracks during processing. In addition, the shape of via and interconnection formed in the low-k film is fragile in its surroundings, leading the structure to be unstable.

Second, the low-k film has low density; for this reason, there is a possibility that process gas and water content permeate from the side of a via hole formed in the film. As a result, the permeated gas desorbs in the film; therefore, this affects the next process.

Thirdly, the low-k film receives damage by dry process such as RIE (reactive ion etching) and ashing, used for processing contact holes and interconnection trenches.

The damage given to the low-k film means a state that the original bond of the low-k film is broken down. For example, in a SiOCH-based low-k film, Si—$CH_3$ and Si—C bonds are broken. As a result, Si-dangling bond is formed, or Si—OH and Si—NH are formed. In the portion having received the damage, the bond is broken; as a result, C (carbon) concentration is reduced. With the reduction of C concentration, the film density is also reduced; for this reason, the portion readily absorbs process gas and water content. The absorbed water content and gas diffuses in the low-k film. This affects the electrical characteristics of the low-k film. More specifically, the effective electric constant of the low-k film increases, leak current is induced between interconnections in the film, and Time Dependent Dielectric Breakdown (TDDB) occurs. These are factors of reducing breakdown voltage reliability. The gas remaining in the low-k film desorbs, and thereby, other films are peeled off. The damaged region having reduced C concentration may be melted due to HF and $NHF_3$-based chemical liquids frequently used in the process of manufacturing the semiconductor device. For this reason, it is difficult to achieve dimension control on the surroundings of the damaged region.

BRIEF SUMMARY OF THE INVENTION

According to a first aspect of the present invention, there is provided a semiconductor comprising: an insulating film having dielectric constant not greater than 2.7 and provided above a semiconductor substrate; a via comprising a conductive material provided in a via hole formed in the insulating film; a first interconnection comprising a conductive material provided in an interconnection trench formed on the via in the insulating film; and a first high-density region formed in the insulating film, having a cylindrical shape surrounding the via hole, an inner surface common to a boundary of the via hole, and a film density higher than the insulating film.

According to a second aspect of the present invention, there is provided a semiconductor device comprising: an insulating film having dielectric constant not greater than 2.7 and provided above a semiconductor substrate; a via comprising a conductive material provided in a via hole formed in the insulating film; a first interconnection comprising a conductive material provided in an interconnection trench formed on the via in the insulating film; and a first high-concentration region formed in the insulating film, having a cylindrical shape surrounding the via hole, an inner surface common to a boundary of the via hole, and a carbon concentration higher than the insulating film.

According to a third aspect of the present invention, there is provided a method of manufacturing a semiconductor device, comprising: forming an insulating film above a semiconductor substrate, the insulating film having dielectric constant not greater than 2.7 and having a via hole; forming a buried insulating film on the insulating film while filling the via hole; forming an interconnection trench connected with the via hole in the buried insulating film and the insulating film; removing the buried insulating film; and filling the via hole and the interconnection trench with a conductive material.

According to a fourth aspect of the present invention, there is provided a method of manufacturing a semiconductor device, comprising: forming a first insulating film above a semiconductor substrate, the insulating film having dielectric constant not greater than 2.7 and having a via hole; forming a second insulating film different from the first insulating film on the first insulating film while filling the via hole, the second insulating film having dielectric constant not greater than 2.7; forming an interconnection trench connected with the via hole in the second insulating film while removing the second insulating film in the via hole; and filling the via hole and the interconnection trench with a conductive material.

DETAILED DESCRIPTION OF THE INVENTION

Embodiments of the present invention will be described below with reference to the accompanying drawings. In the following description, the same reference numerals are used to designate components having the identical function and configuration, and the overlapping explanation is made if necessary.

First Embodiment

Figure 1:
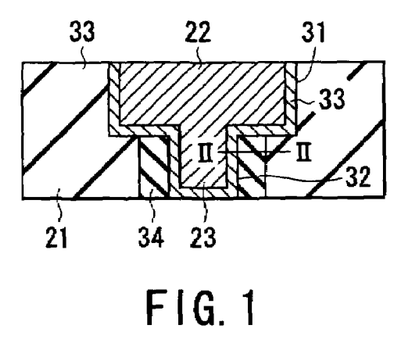
FIG. 1 is a cross-sectional view schematically showing a part of a semiconductor device according to a first embodiment of the present invention.

FIG. 1 is a cross-sectional view schematically showing a semiconductor device according to a first embodiment of the present invention. FIG. 1 shows a part of the semiconductor device having multi-layer interconnection structure. As shown in FIG. 1, an interlayer insulating film 21 is formed containing a porous insulating film. More specifically, SiOC film having dielectric constant k not greater than 2.7 is used as the interlayer insulating film 21. In addition, the following organic polymers (organic polymer films) containing SiOH in place of SiOC may be used. The organic polymers are methyl siloxane, methyl silsesquioxane (MSQ), poly allylene hydrocarbon and benzyoxazole, etc. The interlayer insulating film 21 is formed of a stacked layer of non-low-dielectric (non-low-k) films such as $SiO_2$ and SiC.

The interlayer insulating film 21 is formed with interconnection trench 31 and via hole 32. The interconnection trench 31 and the via hole 32 are filled with conductive materials via a barrier metal 33, and thereby, interconnection 22 and via 23 are formed. The diameter of the via 23 is smaller than the width of the interconnection 22. Cu, Al and W may be used as the conductive materials.

The interlayer insulating film 21 around the via 23 is formed with a high-density region (high concentration region) 34. The high-density region 34 has a film density or carbon concentration higher than the bulk portion of the interlayer insulating film 21. The high-density region 34 has a cylindrical shape surrounding the via 23 (via hole 32), and the inner surface is common to the boundary between the via 23 and interlayer insulating film 21. The high-density region 34 extends from the bottom to the top surface of the interlayer insulating film 21.

The following method is employed as one method of increasing the film density of the high-density region 34. According to the method, insulating materials are permeated into a porous bulk from the inner surface of the opened via 23, and thereby, the film density of the inner surface of the via 23 is improved.

The film density or carbon concentration of the high-density region 34 may be set constant in the foregoing range region, for example, in the diametrical direction of the high-density region 34. As seen from FIG. 2, the film density or carbon concentration continuously may decrease toward the edge from the center of the high-density region 34.

Figure 2:
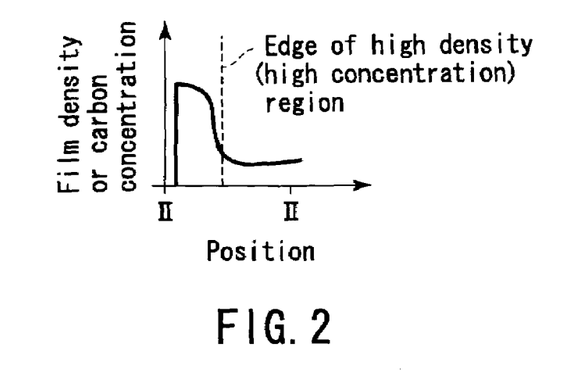
FIG. 2 is a graph showing film density or carbon concentration along a partial region of the device shown in FIG. 1.

The film density or carbon concentration around the interconnection 31 is the same as that of the bulk portion.

Figure 3:
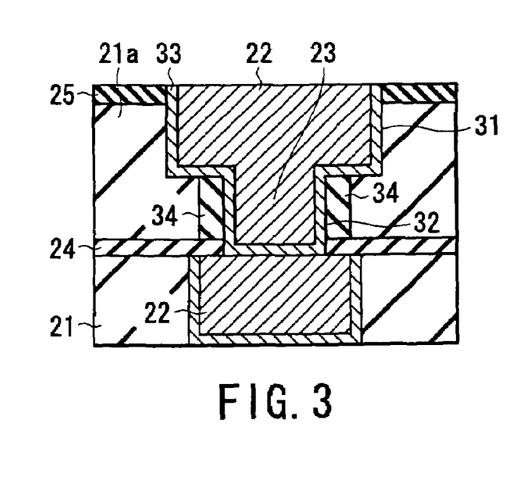
FIG. 3 and FIG. 4 are cross-sectional views schematically showing a respective modification example of the first embodiment.

A modification example of the first embodiment will be explained below. FIG. 3 is a cross-sectional view schematically showing one modification example of the first embodiment. As illustrated in FIG. 3, one layer extending to via 23 and interconnection 22 (hereinafter, referred simply to as one layer) is composed of the following films. The films are anti-diffusion film (stopper film) 24, interlayer insulating film 21a and cap film 25, which are successively stacked from the bottom. The anti-diffusion film 24 is formed of Sic and SiCN, for example, and prevents Cu atom from diffusing from the interconnection to the interlayer insulating film 21a if Cu is used as the interconnection 22.

Figure 4:
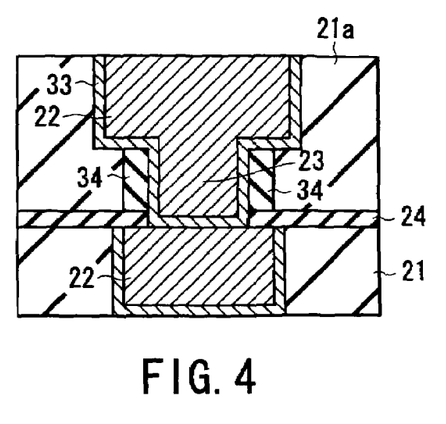

FIG. 4 is a cross-sectional view schematically showing another modification example of the first embodiment, and shows the structure having the interlayer insulating film using no cap film 25. According to the foregoing modification examples, the effect described later is also obtained.

The method of manufacturing the semiconductor device according to the first embodiment will be explained with reference to FIG. 5 to FIG. 10. FIG. 5 to FIG. 10 are cross-sectional views to successively explain the process of manufacturing the semiconductor device according to the first embodiment. Here, the explanation is made giving the case (FIG. 3) where one layer is composed of anti-diffusion film 24, interlayer insulating film 21a and cap film 25 as-one example. The structure having no anti-diffusion film 24 and cap film 25 is realized by omitting the process of forming these films.

Figure 5:
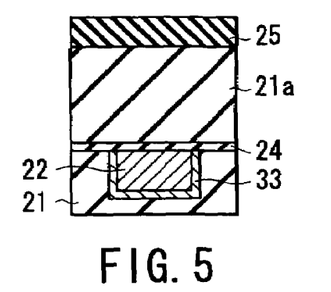
FIGS. 5, 6, 7, 8, 9, and 10 are cross-sectional views successively showing parts of the manufacturing process of the semiconductor device according to the first embodiment, respectively.

As shown in FIG. 5, the bottom interlayer insulating film 21 is formed above a semiconductor substrate (not shown). The interconnection trench on the surface of the interlayer insulating film 21 is formed with the interconnection 22 via the barrier metal 33. The anti-diffusion film 24, interlayer insulating film 21a and cap film 25 are successively deposited on the interlayer insulating film 21 by CVD (chemical vapor deposition) or coating process.

Figure 6:
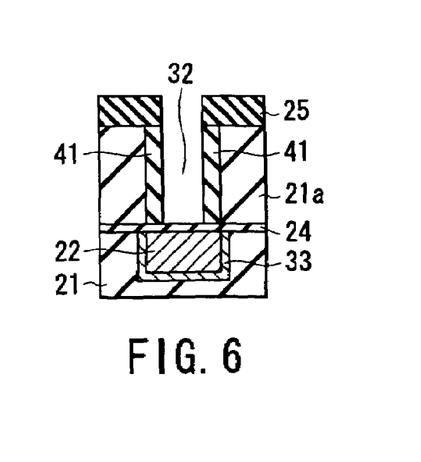

As illustrated in FIG. 6, a resist film (not shown) is deposited on the cap film 25 by coating process. The resist film is formed with a hole opening corresponding to the via hole 32 using lithography and dry etching such as RIE. The cap film 25 and the interlayer insulating film 21a are etched by RIE and so forth using the resist film, and thereby, the via hole 32 is formed. The resist film is removed by ashing. In the processes such as etching and ashing, a damage region 41 by dry etching may be formed in the interlayer insulating film 21a corresponding to the inner wall of the via hole 32.

Figure 7:
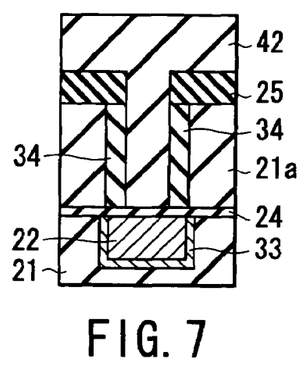

As depicted in FIG. 7, an organic film 42 (buried insulator) is formed on the entire surface of the semiconductor substrate by, for example, coating, and thereafter, heated. The following materials may be used as the organic film 42. One is the same material as the interlayer insulating film 21 (interlayer insulating film 21a). Another is SOG (coated silicon oxide film) containing no C. Another is the material, which is the same as the interlayer insulating film 21 and has film density or carbon concentration higher than the interlayer insulating film 21a. Another is organic polymer and materials having methyl group. Molecular permeates into the interlayer insulating film 21a from the organic film 42 heated after buried in the via hole 32. As a result, the damage region 41 is formed as a high-density region 34.

Figure 8:
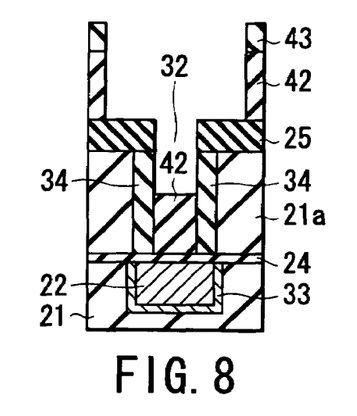

As seen from FIG. 8, hard mask film 43 and resist film (not shown) are formed on the organic film 42. The resist film is formed with a hole opening corresponding to the interconnection pattern (interconnection trench) by lithography and etching. The hard mask film 43 is formed with a pattern by etching using the resist film. Part of the organic film on the cap film 25 is removed by etching using the hard mask film 43 while the organic film 42 in the via hole 32 is etched back.

Figure 9:
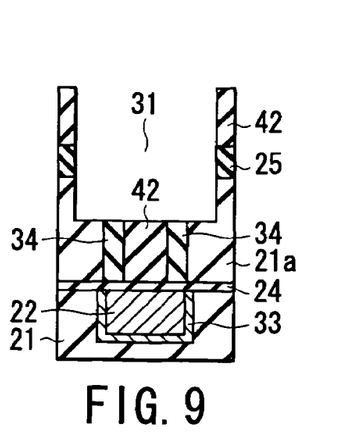

As shown in FIG. 9, part of cap film 25 and interlayer insulating film 21a is removed by etching using the hard mask film 43 under the condition different from the process of FIG. 8. As a result, an interconnection trench 31 is formed.

Figure 10:
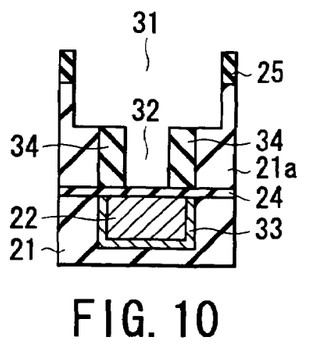

As illustrated in FIG. 10, the hard mask film 43 is removed, and thereafter, the organic film 42 is removed by ashing or wet etching. With wet etching employed, it is possible to prevent the inner wall (surface of interlayer insulating film 21a) of the via hole 32 from again receiving damage. As seen from FIG. 3, the anti-diffusion film 24 is etched, and thereby, the via hole 32 communicates with the interconnection 22. The via hole 32 and the interconnection trench 31 are filled with a conductive material via the barrier metal 33, and thereby, via 23 and interconnection 22 are formed.

In the semiconductor device according to the first embodiment, the high-density region 34 having film density or carbon concentration higher than the interlayer insulating film 21 is formed around the via hole 32 formed in the porous interlayer insulating film 21. As a result, the side of the via hole 32 having received damage in the process is repaired. Thus, it is possible to largely reduce gas and water content intruding into the interlayer insulating film 21 from the side of the via hole 32. Consequently, this serves to prevent the following disadvantages (a) to (d):

(a) Peeling of the upper interlayer insulating film 21 resulting from gas and water content;

(b) Reduction of electrical characteristics of the interlayer insulating film 21;

(c) Leak current between interconnections 22 in the interlayer insulating film 21; and (d) Reduction of breakdown voltage reliability.

The side of the via hole 32 having received damage is repaired, and thereby, it is possible to prevent the side of the via hole 32 from being melted by chemical liquid used in the manufacturing process. Therefore, the dimension around the damage region can be prevented from being largely different from the design dimension.

The high-density region 34 is formed, and thereby, the mechanical strength of the region increases more than that of the bulk region. Thus, the high-density region 34, interlayer insulating film 21 and interconnection 22 around there are stable in its shape and state.

In addition, the high-density region 34 is formed, and thereby, the porosity of the side of the via hole 32 is reduced; in other words, many pores can be filled. Thus, when the via hole 32 is filled with metal materials, it is possible to prevent metal atoms from intruding into the interlayer insulating film 21 from the side of the via hole 32.

Further, according to the first embodiment, the same material as the interlayer insulating film 21 is used as the organic film 42. Thus, matching property is excellent in thermal expansion coefficient, degassing characteristic and adhesion between the organic film 42 and the interlayer insulating film 21. Therefore, the high-density region 34 can be readily formed.

Second Embodiment

According to the second embodiment, the interlayer insulating film 21 is formed of two kinds of low-k films or more.

Figure 11:
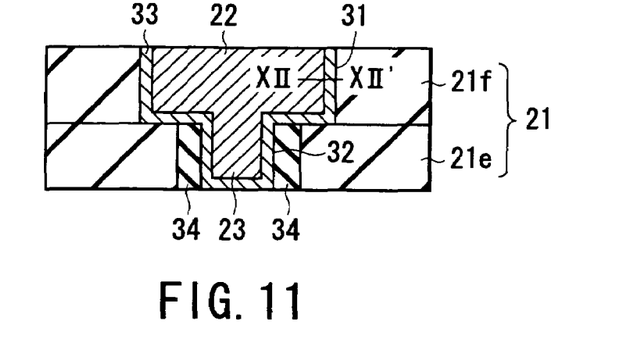
FIG. 11 is a cross-sectional view schematically showing a part of a semiconductor device according to a second embodiment of the present invention.

FIG. 11 is a cross-sectional view schematically showing a part of a semiconductor device according to the second embodiment of the present invention. As shown in FIG. 11, the interlayer insulating film 21 is composed of interlayer insulating films 21e and 21f. The interlayer insulating film 21e consists of methyl siloxane or methyl silsesquioxiane having dielectric constant k not greater than 2.7. The interlayer insulating film 21f consists of organic polymer having dielectric constant k not greater than 2.7. Either of the interlayer insulating films 21e and 21f may be used as the bottom layer. FIG. 11 shows the case where the interlayer insulating films 21e is used as the bottom layer. The interlayer insulating films 21e and 21f have the same features as the interlayer insulating film 21 described in the first embodiment.

Figure 12:
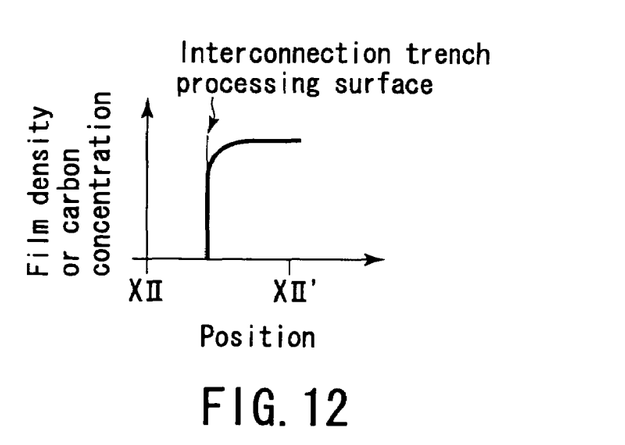
FIG. 12 is a graph showing film density or carbon concentration along a partial region of the device shown in FIG. 11.

The boundary between interlayer insulating films 21e and 21f is situated on the height position as the lower surface of the interconnection trench 31. The interlayer insulating film 21e is formed with the high-density region 34 having the same features as described in the first embodiment. As seen from FIG. 12, film density or carbon concentration on the surroundings of the interconnection trench 31 is the same as the bulk region of the interlayer insulating film 21f.

Figure 13:
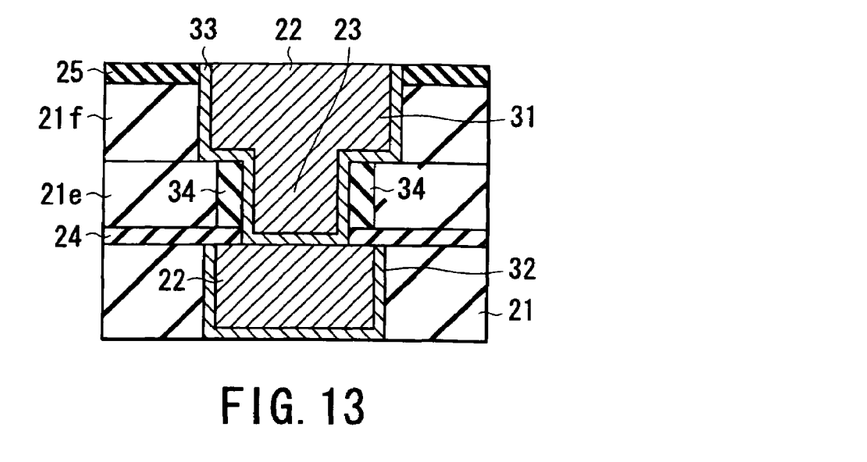
FIGS. 13, 14, 15, 16, 17, and 18 are cross-sectional views schematically showing modification examples of the second embodiment, respectively.

Modification examples of the second embodiment will be explained below. FIG. 13 to FIG. 18 are cross-sectional views schematically showing the modification examples of the second embodiment. As shown in FIG. 13, an interlayer insulating film is composed of anti-diffusion film 24, interlayer insulating films 21e, 21f and cap film 25, which are successively stacked from the bottom.

Figure 14:
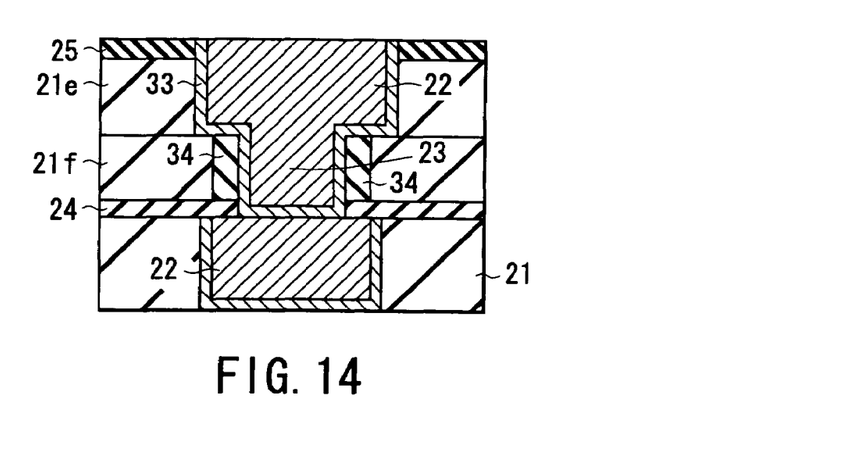

FIG. 14 shows another modification example of the second embodiment. As illustrated in FIG. 14, one layer is composed of anti-diffusion film 24, interlayer insulating films 21f, 21e and cap film 25, which are successively stacked from the bottom. Organic polymer may be used as the material of the cap film 25 of the modification example.

Figure 15:
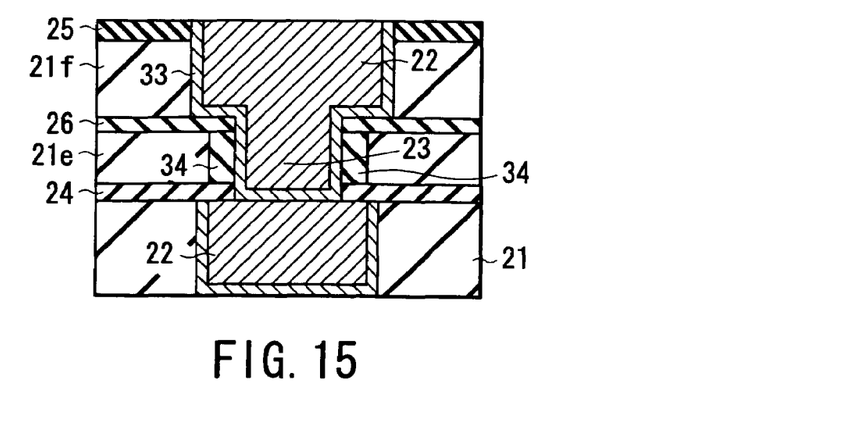

FIG. 15 shows another modification example of the second embodiment. As depicted in FIG. 15, one layer is composed of anti-diffusion film 24, interlayer insulating film 21e, etching stopper film 26, interlayer insulating film 21f and cap film 25, which are successively stacked from the bottom. The etching stopper film 26 functions as a stopper when etching the interconnection trench. For example, $SiO_2$, SiC, SiCN and SiN may be used as the material of the etching stopper film 26.

Figure 16:
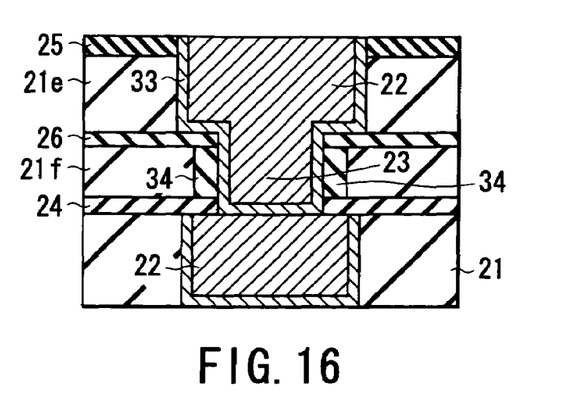

FIG. 16 shows another modification example of the second embodiment. As illustrated in FIG. 16, one layer is composed of anti-diffusion film 24, interlayer insulating film 21f, etching stopper film 26, interlayer insulating film 21e and cap film 25, which are successively stacked from the bottom. Organic polymer may be used as the material of the cap film 25 of FIG. 16.

Figure 17:
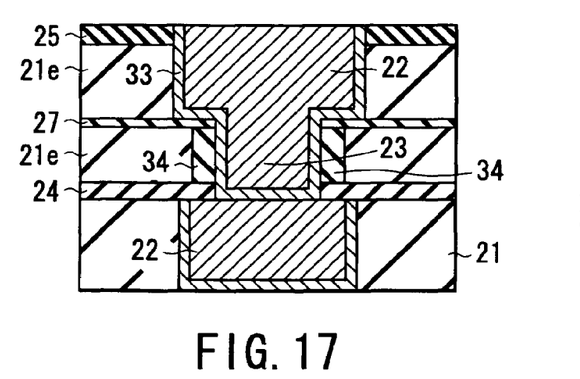

FIG. 17 shows another modification example of the second embodiment. As seen from FIG. 17, one layer is composed of anti-diffusion film 24, interlayer insulating film 21e, etching stopper film 27, interlayer insulating film 21e and cap film 25, which are successively stacked from the bottom. Organic polymer having the same features as the interlayer insulating film 21 may be used as the material of the etching stopper film 27.

Figure 18:
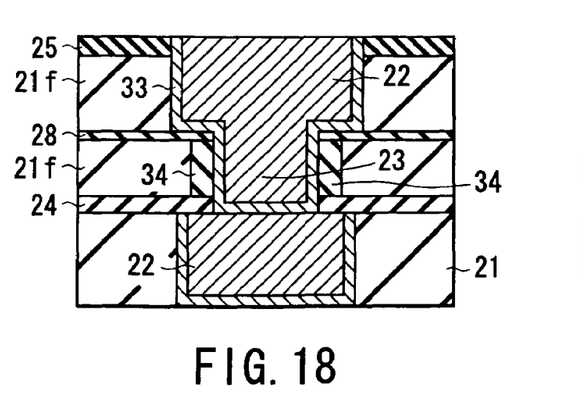

FIG. 18 shows another modification example of the second embodiment. As shown in FIG. 18, one layer is composed of anti-diffusion film 24, interlayer insulating film 21f, etching stopper film 28, interlayer insulating film 21f and cap film 25, which are successively stacked from the bottom. Siloxane or methyl silsesquioxiane having the same features as the interlayer insulating film 21 may be used as the material of the etching stopper film 28.

According to the foregoing modification example, the effect described later can be obtained. In each modification example, the structure excluding the cap film 25 may be employed.

The method of manufacturing the semiconductor device according to the second embodiment will be explained with reference to FIG. 19 to FIG. 23. FIG. 19 to FIG. 23 are cross-sectional views successively showing the process of manufacturing the semiconductor device according to the second embodiment. Here, the explanation is made giving the case (FIG. 13) where one layer is composed of anti-diffusion film 24, interlayer insulating films 21e, 21f and cap film 25 as one example.

Figure 19:
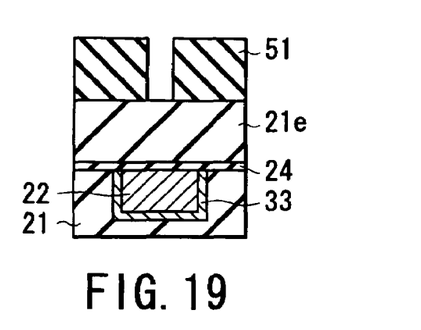
FIGS. 19, 20, 21, 22, and 23 are cross-sectional views successively showing parts of the manufacturing process of the semiconductor device according to the second embodiment, respectively.

As shown in FIG. 19, the lower interlayer insulating film 21 is formed above a semiconductor substrate (not shown). The surface of the interlayer insulating film 21 is formed with the interconnection 22 via the barrier metal 33. Anti-diffusion film 24 and interlayer insulating film 21e are successively deposited on the interlayer insulating film 21 by, for example, CVD or coating process. A resist film 51 having hole opening corresponding to the via hole 32 is formed on the interlayer insulating film 21e.

Figure 20:
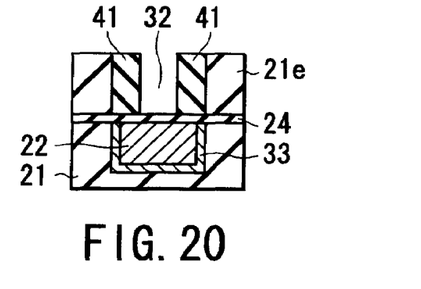

As illustrated in FIG. 20, the interlayer insulating film 21e is etched using the resist film 51, and thereby, the via hole 32 is formed. Thereafter, the resist film 51 is removed by ashing. In the processes such as etching and ashing, a damage region 41 is formed in the interlayer insulating film 21e corresponding to the inner wall of the via hole 32.

Figure 21:
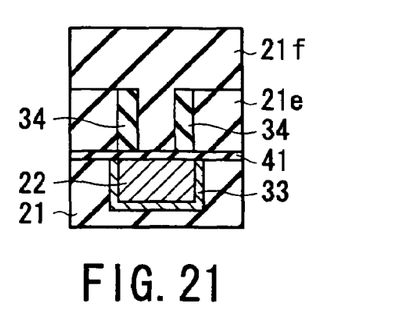

As depicted in FIG. 21, a material film of the interlayer insulating film 21f is formed on the entire surface of the semiconductor substrate. In this case, the via hole 32 is filled with the material film of the interlayer insulating film 21f, and thereby, the damage region 41 having received damage is repaired while the high-density region 34 is formed.

Figure 22:
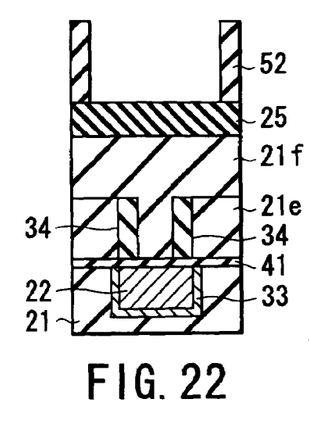

As depicted in FIG. 22, the cap film 25 is formed on the interlayer insulating film 21f. Thereafter, a resist film 52 having hole opening corresponding to the interconnection trench 31 is formed on the cap film 25.

Figure 23:
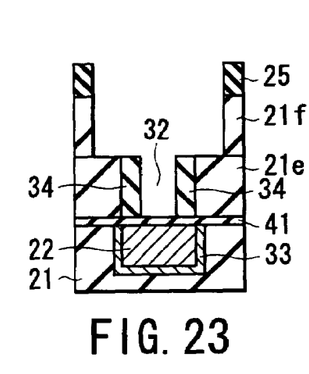

As seen from FIG. 23, the cap film 25 and the interlayer insulating film 21f are etched using the resist film 52. In this case, the interlayer insulating film 21f in the via hole 32 is removed, and thereby, the via hole 32 opens. The resist film 52 is removed, and then the anti-diffusion film 24 is etched to make the via hole 32 communicate with the interconnection 22, as shown in FIG. 13. The via hole 32 and the interconnection trench 31 are filled with a conductive material via the barrier metal 33, and thereby, via 23 and interconnection 22 are formed.

In the semiconductor device according to the second embodiment, one layer has the stacked structure of two interlayer insulating films 21e and 21f, and the remaining parts remain the same as the first embodiment. Thus, the same effect as the first embodiment is obtained.

Further, according to the second embodiment, the interlayer insulating films 21e where the via 23 is formed and the interlayer insulating films 21f where the interconnection 22 is formed consist of the material different from each other. Thus, the etching selectivity is freely taken in the process of etching the via hole 32 and the interconnection trench 31 using RIE and so forth. Therefore, the via hole 32 and the interconnection trench 31 can be readily processed.

Third Embodiment

The third embodiment relates to another method of manufacturing the semiconductor device having the structure described in the second embodiment.

Figure 24:
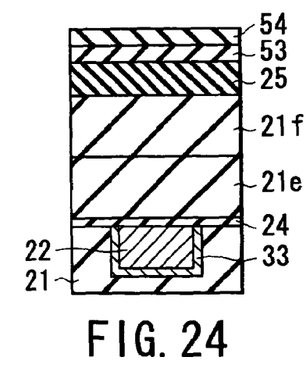
FIGS. 24, 25, 26, 27, 28, 29, and 30 are cross-sectional views successively showing parts of manufacturing process of the semiconductor device according to a third embodiment of the present invention, respectively.

FIG. 24 to FIG. 29 show the third embodiment of the present invention, and are cross-sectional views successively showing the process of manufacturing the semiconductor device according to the second embodiment. As shown in FIG. 24, the lower interlayer insulating film 21 is formed above a semiconductor substrate (not shown). The surface of the interlayer insulating film 21 is formed with the interconnection 22 via the barrier metal 33. The stopper film 24, interlayer insulating film 21e and cap film 25 are successively deposited on the interlayer insulating film 21 by CVD or coating process. Thereafter, hard mask films 53 and 54 are successively formed on the cap film 25.

Figure 25:
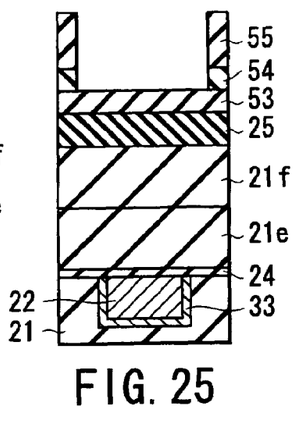

As illustrated in FIG. 25, a resist film 55 having a hole opening corresponding to the interconnection trench 31 is formed on the hard mask film 54. The hard mask film 54 is etched using the resist film 55 as a mask.

Figure 26:
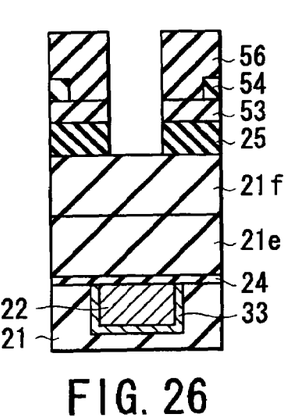

As depicted in FIG. 26, the resist film 55 is removed, the entire surface of the semiconductor substrate is formed with a resist film 56 having a hole opening corresponding to the via hole 32. Hard mask film 53 and cap film 25 are etched using the resist film 56 as a mask.

Figure 27:
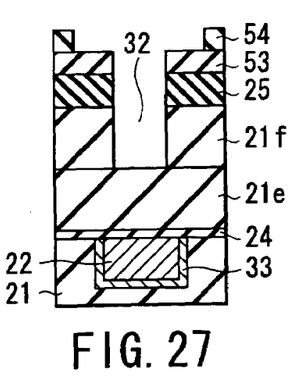

As seen from FIG. 27, the resist film 56 is removed, the interlayer insulating film 21f is etched using the hard mask film 53 as a mask. As a result, the interlayer insulating film 21f is formed with a hole opening corresponding to the via hole 32.

Figure 28:
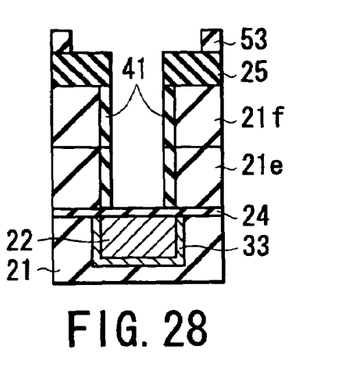

As shown in FIG. 28, the interlayer insulating film 21e is etched using the hard mask film 53 as a mask and thereby, the interlayer insulating film 21e is formed with the via hole 32. During the formation of the via hole 32, the interlayer insulating films 21e and 21f corresponding to the inner wall of the via hole 32 may be formed with the damage region 41. The hard mask film 53 is etched using the hard mask film 54 as a mask, and thereby, the hard mask film 53 is formed with a hole opening corresponding to the interconnection trench 31. Thereafter, the hard mask film 54 is removed.

Figure 29:
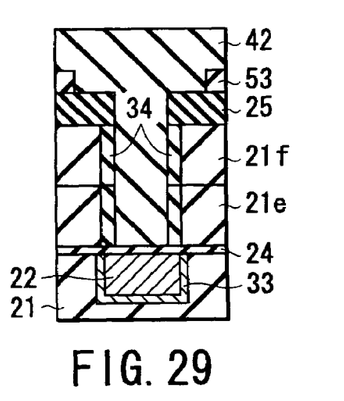

As illustrated in FIG. 29, the organic film 42 is formed on the entire surface of the semiconductor substrate and heated. The damage region 41 having received damage is repaired by the organic film 42 buried in the via hole 32 and heated to form the high-density region 34.

Figure 30:
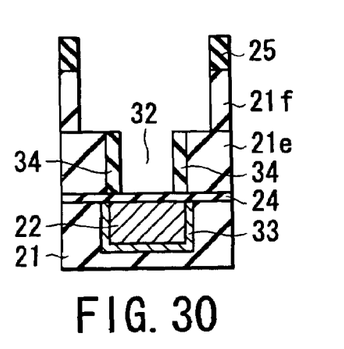

As depicted in FIG. 30, the organic film 42 and the hard mask film 53 are removed. In this case, the organic film 42 may be removed using wet etching. Thereafter, the anti-diffusion film 24 is etched as shown in FIG. 13. The via hole 32 and the interconnection trench 31 are filled with conductive material via the barrier metal 33, and thereby, via 23 and interconnection 22 are formed.

Figure 37:
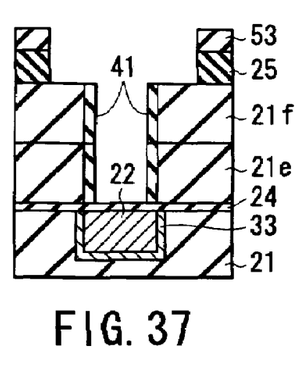
FIG. 37 is a cross-sectional view showing a part of the manufacturing process of a semiconductor device according to a first modification example of the third embodiment.
Figure 38:
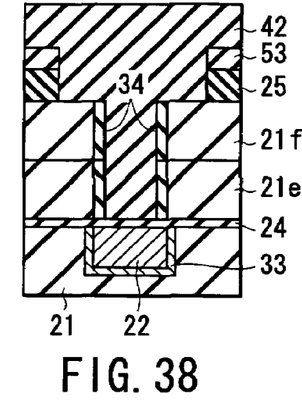
FIG. 38 is a cross-sectional view showing a part of the process following FIG. 37.
Figure 39:
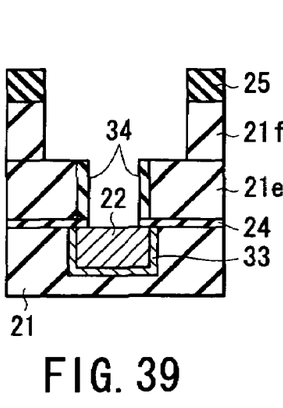
FIG. 39 is a cross-sectional view showing a part of the process following FIG. 38.

A first modification example (variation) of the third embodiment will be explained below with reference to FIG. 13 and FIG. 37 to FIG. 39. FIG. 37 to FIG. 39 are cross-sectional views showing a part of the process of manufacturing a semiconductor device according to the first modification example of the third embodiment. The same processes up to FIG. 27 are carried out. As shown in FIG. 37, the interlayer insulating film 21e is etched by RIE and so forth using the hard mask 53. The hard mask 53 and the cap film 25 are etched by RIE and so forth using the hard mask 54, and the hard mask 54 is removed.

As illustrated in FIG. 38, the organic film 42 is formed on the entire surface of the semiconductor substrate and heated. As a result, the damage region 41 is formed as the high-density region 34.

As depicted in FIG. 39, the organic film 42 is removed by wet etching. The interlayer insulating film 21f is etched by RIE and so forth using the hard mask 53, and thereby, the interconnection trench is formed. Simultaneously, the anti-diffusion film 24 is etched using the interlayer insulating film 21f as the mask, and thereby, via hole 32 and interconnection 33 are connected and the hard mask film 53 is removed. As seen from FIG. 13, the via hole 32 and the interconnection trench 31 are filled with conductive materials via the barrier metal 33, and thereby, via 23 and interconnection 22 are formed.

Figure 40:
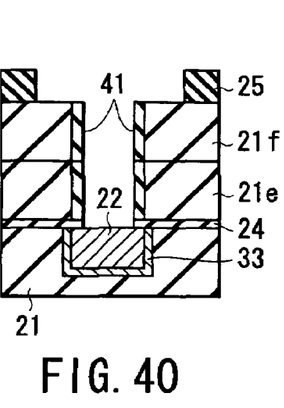
FIG. 40 is a cross-sectional view showing a part of the manufacturing process of a semiconductor device according to a second modification example of the third embodiment.
Figure 41:
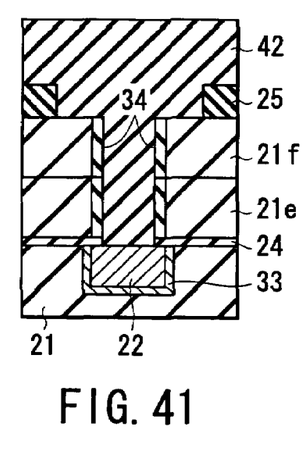
FIG. 41 is a cross-sectional view showing a part of the process following FIG. 40.

A second modification example of the third embodiment will be explained below with reference to FIG. 13, FIG. 40 and FIG. 41. FIG. 40 and FIG. 41 are cross-sectional views showing a part of the process of manufacturing a semiconductor device according to the second modification example of the third embodiment. The same processes up to FIG. 37 of the first modification example are carried out. As shown in FIG. 40, the anti-diffusion film 24 is etched by RIE and so forth using the interlayer insulating film 21f as a mask and the hard mask 53 is removed.

As illustrated in FIG. 41, the organic film 42 is formed on the entire surface of the semiconductor substrate by coating and so forth and heated. As a result, the damage region 41 is formed as the high-density region 34.

As depicted in FIG. 39, the organic film 42 is removed by wet etching. The interlayer insulating film 21f is etched by RIE and so forth using the cap film 25 as a mask, and thereby, the interconnection trench is formed.

As seen from FIG. 13, the via hole 32 and the interconnection trench 31 are filled with conductive materials via the barrier metal 33, and thereby, via 23 and interconnection 22 are formed.

Figure 42:
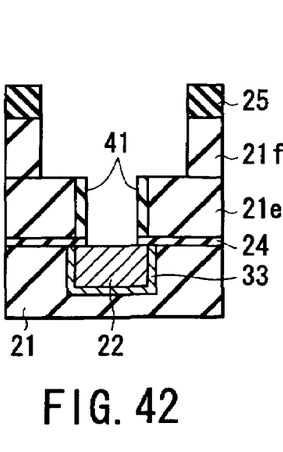
FIG. 42 is a cross-sectional view showing a part of the manufacturing process of a semiconductor device according to a third modification example of the third embodiment.
Figure 43:
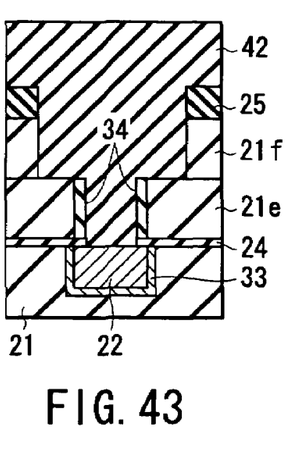
FIG. 43 is a cross-sectional view showing a part of the process following FIG. 42.

A third modification example of the third embodiment will be explained below with reference to FIG. 13, FIG. 42 and FIG. 43. FIG. 42 and FIG. 43 are cross-sectional views respectively showing parts of the process of manufacturing a semiconductor device according to the third modification example of the third embodiment. The same processes up to FIG. 40 of the second modification example are carried out. As shown in FIG. 42, the interlayer insulating film 21f is etched by RIE and so forth using the cap film 25 as a mask, and thereby, the interconnection trench is formed.

As illustrated in FIG. 43, the organic film 42 is formed on the entire surface of the semiconductor substrate by coating and so forth and heated. As a result, the damage region 41 is formed as the high-density region 34. As depicted in FIG. 39, the organic film 42 is removed.

As seen from FIG. 13, the via hole 32 and the interconnection trench 31 are filled with conductive materials via the barrier metal 33, and thereby, via 23 and interconnection 22 are formed.

According to the manufacturing method of the third embodiment, the same structure as the second embodiment is realized in the semiconductor device.

Fourth Embodiment

According to the fourth embodiment, the high-density region is formed around the interconnection trench in addition to the first and second embodiments.

Figure 31:
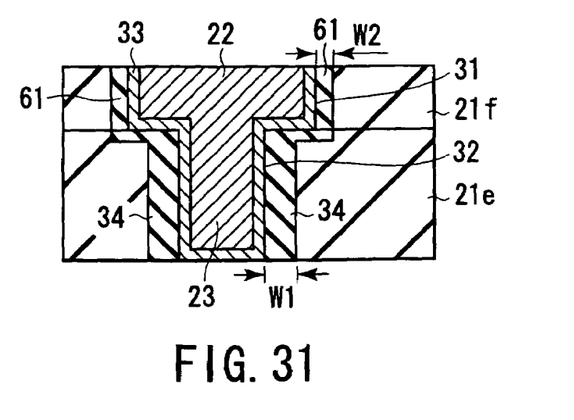
FIG. 31 is a cross-sectional view schematically showing a part of a semiconductor device according to a fourth embodiment of the present invention.

FIG. 31 is a cross-sectional view showing a part of the process of manufacturing a semiconductor device according to the fourth embodiment of the present invention. Here, the explanation is made giving the case where one layer is composed of two interlayer insulating films 21e and 21f (corresponding to FIG. 11 of the second embodiment) as one example. However, the fourth embodiment is also applicable to all of the first and second embodiments including modification examples.

As shown in FIG. 31, the interlayer insulating film 21f around the interconnection trench 31 is formed with a high-density region 61. The high-density region 61 has the same features as the high-density region 34 except for the following point. The distance W2 (width of high-density region) from the end of the interconnection trench 31 is smaller than the distance W1 from the inner surface of the high-density region 34 to the edge.

Figure 32:
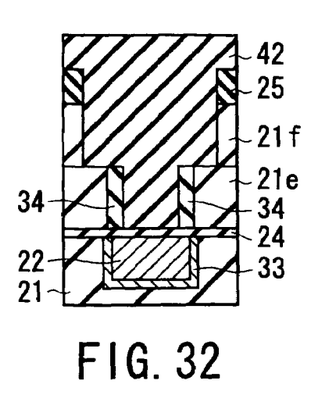
FIG. 32 is a cross-sectional view explaining a part of the manufacturing process of the semiconductor device according to the fourth embodiment.

The method of manufacturing the semiconductor device according to the fourth embodiment will be explained below with reference to FIG. 32. The same processes up to FIG. 23 or FIG. 30 of the second embodiment are carried out. As shown in FIG. 32, the organic film 42 is formed on the entire surface of the semiconductor substrate. The organic film 42 is buried in the interconnection trench 31 and the via hole 32, and thereby, the high-density region 61 is formed while the diameter of the high-density region 34 increases. As a result, the structure shown in FIG. 31 is obtained.

After the process of FIG. 23 or FIG. 30, the high-density region 61 may be formed using energy irradiation such as ultraviolet rays and Ar and He ion irradiation.

The process of FIG. 32 is carried out after the process of FIG. 10, and thereby, the combined structure of the fourth and first embodiments is obtained.

Figure 33:
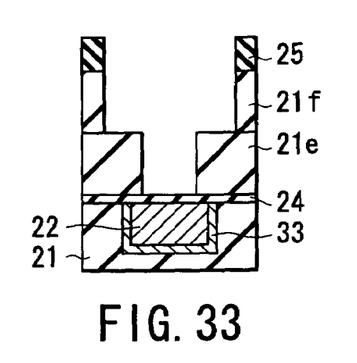
FIG. 33 is a cross-sectional view schematically showing one modification example of the fourth embodiment.

The following process may be employed. The interlayer insulating films 21e and 21f are formed with via hole 32 and interconnection trench 31 without previously forming high-density regions 34 and 61. Thereafter, the high-density regions 34 and 61 are formed together. More specifically, as shown in FIG. 33, anti-diffusion film 24, interlayer insulating films 21e, 21f and cap film 25 are formed on the interlayer insulating film 21. The interlayer insulating film 21e is formed with the via hole 32 by photolithography and etching while the interlayer insulating film 21f is formed with the interconnection trench 31.

Figure 34:
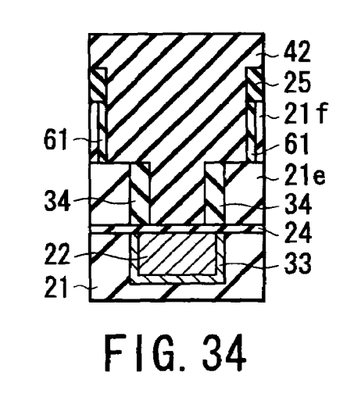
FIG. 34 is a cross-sectional view explaining a part of the manufacturing process of the semiconductor device according to one modification example of the fourth embodiment.

As illustrated in FIG. 34, the via hole 32 and the interconnection trench 31 are filled with the organic film 42, and thereby, high-density regions 34 and 61 are formed together. In this case, the porosity of the interlayer insulating film 21e is set higher than that of the interlayer insulating film 21f. By doing so, the distance W1 is formed larger than the width W2 of the high-density region 61. Alternatively, the film density of the interlayer insulating film 21e may be set smaller than that of the interlayer insulating film 21f. By doing so, the same structure as described above is realized.

In the semiconductor device according to the fourth embodiment of the present invention, the via hole 32 in the interlayer insulating film 21e is surrounded by the high-density region 34 which has film density or carbon concentration higher than the interlayer insulating film 21e. Thus, the same effect as the first and second embodiments is obtained.

Further, according to the fourth embodiment, the high-density region 61 similar to the high-density region 34 is formed around the interconnection trench 31 in the interlayer insulating film 21f. Thus, the effect obtained around the via hole 32 in the first embodiment is provided around the interconnection trench 31.

Fifth Embodiment

According to the fifth embodiment, high-density regions 34 and 61 are formed like the first, second and fourth embodiments. In addition, the width W2 of the high-density region 61 is determined taking a distance to neighboring interconnections 22 into consideration.

Figure 35:
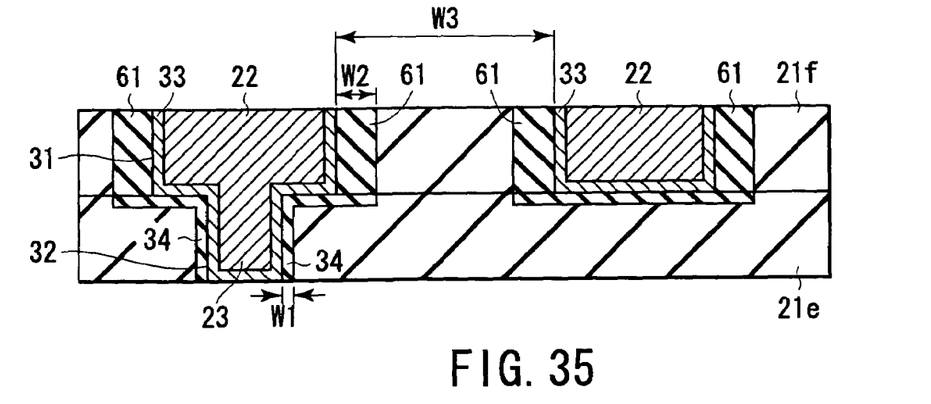
FIG. 35 is a cross-sectional view schematically showing a part of a semiconductor device according to a fifth embodiment of the present invention.

FIG. 35 is a cross-sectional view showing a part of a semiconductor device according to the fifth embodiment of the present invention. Here, the explanation is made giving the case where one layer is composed of two interlayer insulating films 21e and 21f (corresponding to FIG. 11 of the second embodiment) as one example. However, the fifth embodiment is also applicable to all of the first and second embodiments including modification examples.

As shown in FIG. 35, the width W2 of the high-density region 61 is set less than 25% of the shortest distance W3 between interconnections in the interlayer insulating film 21f. If the condition of 0.25×distance W3>diameter W2 is satisfied, the distance W3 can take any value. The width W1 is not greater than the width W2.

The semiconductor device according to the fifth embodiment, the same effect as the first, second and fourth embodiments is obtained. Further, according to the fifth embodiment, the width W2 of the high-density region 61 is set less than 25% of the shortest distance W3 between interconnections in the interlayer insulating film 21f. Thus, it is possible to prevent the high-density region 61 from contributing to an increase of capacitance between mutually neighboring interconnections 22.

Sixth Embodiment

According to the sixth embodiment high-density regions 34 and 61 are formed like the first, second and fourth embodiments. In addition, each film density of two interlayer insulating films forming one layer and each film density of high-density regions formed in these films have a predetermined relationship described below.

Figure 36:
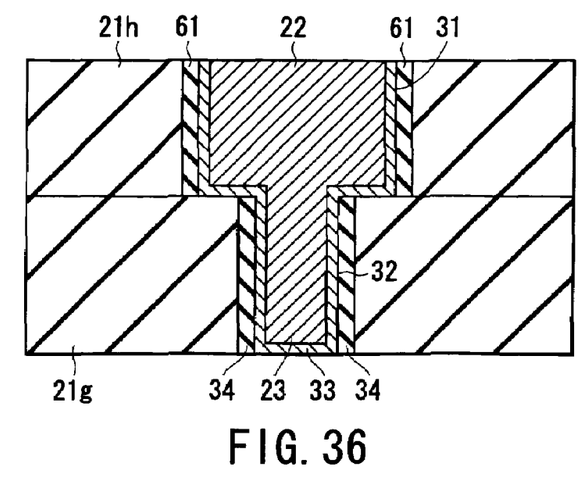
FIG. 36 is a cross-sectional view schematically showing a part of a semiconductor device according to a sixth embodiment of the present invention.

FIG. 36 is a cross-sectional view showing a part of a semiconductor device according to the sixth embodiment of the present invention.

As seen from FIG. 36, one layer is composed of an interlayer insulating film 21g and an interlayer insulating film 21h formed thereon. The interlayer insulating films 21g and 21h consist of siloxane, methyl silsesquioxiane and organic polymer, like the interlayer insulating film 21 described before.

The interlayer insulating film 21g has dielectric constant not greater than 2.5. The interlayer insulating film 21h has dielectric constant lower than the interlayer insulating film 21g. For example, the dielectric constant k of the interlayer insulating film 21g is 2.5, and the dielectric constant k of the interlayer insulating film 21h is 2.2.

Here, the film densities of high-density region 34, interlayer insulating film 21g, high-density region 61 and interlayer insulating film 21h are represented by $N_{via1}$, $N_{via2}$, $N_{ILD1}$ and $N_{ILD2}$, respectively and the following relation (1) is satisfied between $N_{ILD2}$ and $N_{via1}$. The explanation about the film density will be made below, however the relation about the values of the carbon concentration can be also established.

$$N_{ILD2} < N_{via1} \tag{1}$$

Any of the following equations (2) to (5) including the relation of the equation (1) is formed between $N_{via1}$, $N_{via2}$, $N_{ILD1}$ and $N_{ILD2}$.

$$N_{ILD2} < N_{ILD1} = N_{via2} = N_{via1} \tag{2}$$

$$N_{ILD2} < N_{ILD1} = N_{via2} < N_{via1} \tag{3}$$

$$N_{ILD2} < N_{ILD1} < N_{via2} < N_{via1} \tag{4}$$

$$N_{ILD2} < N_{via2} < N_{ILD1} < N_{via1} \tag{5}$$

In the semiconductor device according to the sixth embodiment, the same effect as the first, second and fourth embodiments is obtained. Further, according to the sixth embodiment, when the film density of the interlayer insulating film 21g is higher than that of the interlayer insulating film 21h, the high-density region 34 has a film density higher than the interlayer insulating film 21h. In other words, the film density of the film 21h which has the biggest contribution to an increase of capacitance between interconnections 22 is the smallest among interlayer insulating films 21g, 21h, high-density regions 34 and 61. Therefore, the increase of the capacitance between interconnections 22 can be prevented.

The distance W1 from the inner surface of the high-density region 34 to the edge and the width W2 of the high-density region 61 may also satisfy the relations described in the fourth and fifth embodiments. This serves to further prevent the increase of the capacitance between interconnections 22.

The structure shown in each embodiment is applicable to a layer where so-called intermediate interconnection (and plug) is formed, and a layer where the semi-global interconnection (and plug) is formed in multi-layer interconnection structure. Depending on the interconnection layer, the structure and material of the interlayer insulating film are different. Local, intermediate and semi-global interconnection layers are successively stacked from the surface of the semiconductor substrate. Two or more intermediate and semi-global interconnection layers may be formed. A porous insulating film having dielectric constant not greater than 2.3 is mainly used as the interlayer insulating film of local and intermediate interconnection layers. A material having dielectric constant not greater than 3 is mainly used as the interlayer insulating film of the semi-global interconnection layer. Note that global interconnection layers(s) may be formed on the semi-global interconnection layer. Non-low-k material (e.g., 4 or more) is mainly used in the global interconnection layer.

Each embodiment is especially effective to interlayer insulating films having porosity not lower than 15% or film density not greater than 1.2 g/cm$^3$.

In some manufacture processes (including modification examples) of the foregoing embodiments, after the via hole 32 opens, the damage region 41 is formed as the high-density region 34 before opening the anti-diffusion film 24. Thus, oxidation of the surface of the interconnection 22 and generation of reactants can be prevented in the process of filling and heating the organic film 42. In some manufacture processes, the anti-diffusion film 24 opens, and then the organic film 42 is filled and heated. However, temperature and time given to the organic film 42 may be optimized or the atmosphere of the reactor may be inert gas atmosphere, which can avoid oxidation of the surface of the interconnection 22 and generation of reactants. Thus, the process of filling and heating the organic film 42 is carried out regardless of the timing of before and after the anti-diffusion film 24 opens.

The process of filling and heating the organic film 42 is not limited to the position described in the manufacture process of the foregoing embodiments. More specifically, since many methods of forming via and interconnection generally exist, it is impossible to explain all methods. However, treatment by organic film 42 can be given in any process after the exposure of the inner surface of the via hole or interconnection trench in the interlayer insulating film as long as it is carried out based on the concept of filling and heating of the organic film 42.

In each embodiment, the interlayer insulating film 21 may be formed of the stacked film of organic polymer film and SiOC film, and single material and dual damascene structure. The cap film and the anti-diffusion film 24 may be stacked layer including a low-k film. The present invention is not limited by the structure of the low-k film and the structure of the non-low-k film stacked together with the low-k film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an insulating film having dielectric constant not greater than 2.7 and provided above a semiconductor substrate;
a via comprising a conductive material provided in a via hole formed in the insulating film;
a first interconnection comprising a conductive material provided in an interconnection trench formed on the via in the insulating film; and
a first high-density region formed in the insulating film, having a cylindrical shape surrounding the via hole, an inner surface common to a boundary of the via hole, a film density higher than the insulating film, and a film density which is maximum at the boundary of the via hole and continuously decreases towards a boundary opposite to the via hole.

2. The device according to claim 1, wherein the first high-density region has the film density greater than the insulating film.

3. The device according to claim 1, wherein a diameter of the first high-density region is smaller than a width of the interconnection trench.

4. The device according to claim 1, further comprising: a second high-density region formed in the insulating film, and having a cylindrical shape surrounding the interconnection trench, an inner surface common to a boundary of the interconnection trench and a film density higher than the insulating film.

5. The device according to claim 4, wherein the second high-density region has the film density greater than the insulating film.

6. The device according to claim 4, wherein the first high-density region is thicker than the second high-density region.

7. The device according to claim 4, wherein the second high-density region is thicker than the first high-density region.

8. The device according to claim 4, wherein the thickness of the second high-density region is less than 25% of the minimum distance between second interconnections formed in the insulating film.

9. The device according to claim 4, wherein the insulating film includes: a first insulating film provided at any height from a bottom end to a top end of the via hole; and a second insulating film provided at any height from a bottom end to a top end of the interconnection trench.

10. The device according to claim 9, wherein the second insulating film has a dielectric constant lower than the first insulating film, and a following relation is satisfied:

$N_{ILD2} < N_{ILD1} = N_{via2} \leqq N_{via1}$ or $N_{ILD2} < N_{ILD1} = N_{via2} < N_{via1}$ or $N_{ILD2} < N_{via2} = N_{ILD1} < N_{via1}$ where, $N_{via1}$: film density of the first high-density region
$N_{via2}$: film density of the first insulating film
$N_{ILD1}$: film density of the second high-density region
$N_{ILD2}$: film density of the second insulating film.

11. The device according to claim 9, wherein the first insulating film consists substantially of an organic polymer having a dielectric constant not greater than 2.3, and the second insulating film consists substantially of an organic polymer different from the first insulating film having a dielectric constant not greater than 2.7.

12. The device according to claim 1, wherein the insulating film consists substantially of an organic polymer having a dielectric constant not greater than 2.7.

13. The device according to claim 1, wherein the insulating film has a porosity not lower than 15% or film density not greater than 1.2 g/cm$^3$.

14. A semiconductor device comprising: an insulating film having dielectric constant not greater than 2.7 and provided above a semiconductor substrate; a via comprising a conductive material provided in a via hole formed in the insulating film; a first interconnection comprising a conductive material provided in an interconnection trench formed on the via in the insulating film; and a first high-concentration region formed in the insulating film, having a cylindrical shape surrounding the via hole, an inner surface common to a boundary of the via hole, and a carbon concentration higher than the insulating film.

15. The device according to claim 14, wherein the first high-concentration region has the carbon concentration greater than the insulating film.

16. The device according to claim 14, wherein the first high-concentration region has the maximum carbon concentration in a boundary between the via hole and the first high-concentration region.

17. The device according to claim 14, wherein a diameter of the first high-concentration region is smaller than a width of the interconnection trench.

18. The device according to claim 14, further comprising: a second high-concentration region formed in the insulating film, and having a cylindrical shape surrounding the interconnection trench, an inner surface common to a boundary of the interconnection trench and a carbon concentration higher than the insulating film.

19. The device according to claim 18, wherein the second high-concentration region has the carbon concentration greater than the insulating film.

20. The device according to claim 18, wherein the first high-concentration region is thicker than the second high-concentration region.

21. The device according to claim 18, wherein the second high-concentration region is thicker than the first high-concentration region.

22. The device according to claim 18, wherein the thickness of the second high-concentration region is less than 25% of the minimum distance between second interconnections formed in the insulating film.

23. The device according to claim 18, wherein the insulating film includes: a first insulating film provided at any height from a bottom end to a top end of the via hole; and a second insulating film provided at any height from a bottom end to a top end of the interconnection trench.

24. The device according to claim 23, wherein the second insulating film has a dielectric constant lower than the first insulating film, and a following relation is satisfied:

$$N_{ILD2} < N_{ILD1} = N_{via2} \leq N_{via1} \text{ or}$$

$$N_{ILD2} < N_{ILD1} = N_{via2} < N_{via1} \text{ or}$$

$$N_{ILD2} < N_{via2} = N_{ILD1} < N_{via1}$$

where, $N_{via1}$: carbon concentration of the first high-concentration region $N_{via2}$: carbon concentration of the first insulating film $N_{ILD1}$: carbon concentration of the second high-concentration region $N_{ILD2}$: carbon concentration of the second insulating film.

25. The device according to claim 23, wherein the first insulating film consists substantially of an organic polymer having a dielectric constant not greater than 2.3, and the second insulating film consists substantially of an organic polymer different from the first insulating film having a dielectric constant not greater than 2.7.

26. The device according to claim 14, wherein the insulating film consists substantially of an organic polymer having a dielectric constant not greater than 2.7.

27. The device according to claim 14, wherein the insulating film has a porosity not lower than 15% or film density not greater than 1.2 g/cm$^3$.

* * * * *